US009638727B2

(12) United States Patent
Zheng et al.

(10) Patent No.: US 9,638,727 B2
(45) Date of Patent: May 2, 2017

(54) POWER INDUCTOR AND METHOD FOR IMPLEMENTING SHUNTING MEASUREMENT THROUGH INDUCTOR WINDING

(71) Applicant: Eaton Corporation, Cleveland, OH (US)

(72) Inventors: David Zheng, Guangdong (CN); Denis Liu, Guangdong (CN); Caustic Li, Guangdong (CN)

(73) Assignee: Eaton Corporation, Cleveland, OH (US)

( * ) Notice: Subject to any disclaimer, the term of this patent is extended or adjusted under 35 U.S.C. 154(b) by 42 days.

(21) Appl. No.: 14/420,132

(22) PCT Filed: Aug. 7, 2013

(86) PCT No.: PCT/CN2013/081011
§ 371 (c)(1),
(2) Date: Feb. 6, 2015

(87) PCT Pub. No.: WO2014/023233
PCT Pub. Date: Feb. 13, 2014

(65) Prior Publication Data
US 2015/0219695 A1 Aug. 6, 2015

(30) Foreign Application Priority Data
Aug. 7, 2012 (CN) .......................... 2012 1 0291520

(51) Int. Cl.
*G01R 19/00* (2006.01)
*H01F 27/40* (2006.01)
(Continued)

(52) U.S. Cl.
CPC ......... *G01R 19/0092* (2013.01); *H01F 27/24* (2013.01); *H01F 27/28* (2013.01);
(Continued)

(58) Field of Classification Search
CPC ..... G01R 19/0092; H01F 27/38; H01F 27/24; H01F 27/29; H01F 27/28; H01F 27/402
(Continued)

(56) References Cited

U.S. PATENT DOCUMENTS

| 6,429,639 B1 * | 8/2002 | Pelly | .................... G01R 15/202 |
| | | | 324/117 H |
| 2003/0137382 A1 * | 7/2003 | Mayfield | ................. H01F 38/30 |
| | | | 336/182 |

(Continued)

FOREIGN PATENT DOCUMENTS

| CN | 2743945 | 11/2006 |
| CN | 101145477 | * 3/2008 |

(Continued)

OTHER PUBLICATIONS

European Search Opinion corresponding to European Patent Application No. 13 828 028.4 dated Mar. 30, 2016; 8 pages.*
International Search Report, PCT/CN2013/081011, Nov. 21, 2013.
European Search Report Corresponding to European Patent Application No. 13 828 028.4; Dated: Mar. 30, 2016; 6 Pages.

*Primary Examiner* — Billy Lactaoen
(74) *Attorney, Agent, or Firm* — Ward and Smith, P.A.

(57) ABSTRACT

Disclosed is a power inductor. The inductor comprises a magnetic core and multiple lines. The multiple lines have a first terminal and a second terminal, are parallel with each other, and wind the magnetic core to form a winding. The lines at the first terminal depart from the magnetic core at the same position, and the lines at the second terminal depart from the magnetic core at the same position. At least one line at the first terminal forms a first interface end, the other lines at the first terminal, which are not utilized to form the first interface end, form a second interface end, and the lines at the second terminal together form a third interface end. By measuring the current flowing through the first interface end using a current sensor with a small measuring range, the (Continued)

current flowing through the power inductor can be estimated based on ratio.

18 Claims, 2 Drawing Sheets

(51) Int. Cl.
*H01F 27/28* (2006.01)
*H01F 27/24* (2006.01)
*H01F 27/29* (2006.01)
*H01F 27/38* (2006.01)

(52) U.S. Cl.
CPC ............ *H01F 27/29* (2013.01); *H01F 27/38* (2013.01); *H01F 27/402* (2013.01)

(58) Field of Classification Search
USPC .......................................................... 324/72
See application file for complete search history.

(56) References Cited

U.S. PATENT DOCUMENTS

| | | |
|---|---|---|
| 2004/0263305 A1 | 12/2004 | Oughton et al. |
| 2008/0197961 A1 | 8/2008 | Patel |
| 2012/0026706 A1 | 2/2012 | Ikriannikov |
| 2012/0106207 A1 | 5/2012 | Tsai et al. |

FOREIGN PATENT DOCUMENTS

| | | | |
|---|---|---|---|
| CN | 102545611 | | 7/2012 |
| CN | 102590580 | | 7/2012 |
| DE | 10 2008 053412 A1 | | 5/2010 |
| EP | 0 547 120 A1 | | 6/1993 |
| GB | 2282893 | | 4/1995 |
| JP | H06174755 | | 6/1994 |
| JP | 2006310539 A | * | 11/2006 |

* cited by examiner

POWER INDUCTOR AND METHOD FOR IMPLEMENTING SHUNTING MEASUREMENT THROUGH INDUCTOR WINDING

RELATED APPLICATIONS

The present application is a 35 U.S.C. §371 national phase application of PCT International Application No. PCT/CN2013/081011, having an international filing date of Aug. 7, 2013, claiming priority to Chinese Patent Application No. 201210291520.3, filed Aug. 7, 2012. The disclosures of each application are incorporated herein by reference in their entireties. The above PCT International Application was published in the Chinese language as International Publication No. WO 2014/023233.

FIELD OF THE INVENTION

The present invention generally relates to a power inductor, and more particularly, to a power inductor and method for implementing shunting measurement through inductor winding.

BACKGROUND OF THE INVENTION

Generally, the arrangement of the incoming and outgoing lines of the power inductor is single in and single out with copper foil or litz wire. When the arrangement is single in and single out, it is not cost-effective in the application of high power UPS or high power inverter, since the inductive current will be very high and have to be measured by a current sensor with a large measuring range. If using multiple independent insulate flat conductors or using litz wires, the proportional shunting would not be accurate because of skin effect and proximity effect which are hard to overcome, and therefore it would be hard to implement shunting measurement and the cost of material and winding would be very high.

SUMMARY OF THE INVENTION

The technical problem to be solved in the present invention is to provide a device and method for measuring current in high current situations by using a current sensor with a small measuring range. To deal with this problem, a power inductor comprising a magnetic core and multiple lines is provided in the present invention. The multiple lines have a first terminal and a second terminal, are parallel with each other, and wind the magnetic core to form a winding. The lines at the first terminal depart from the magnetic core at the same position, and the lines at the second terminal depart from the magnetic core at the same position. At least one line at the first terminal forms a first interface end, the other lines at the first terminal, which are not utilized to form the first interface end, form a second interface end, and the lines at the second terminal together form a third interface end. By measuring the current flowing through the first interface end using a current sensor with a small measuring range, the current flowing through the third interface end can be estimated based on the ratio between the numbers of the lines.

As a further improvement of the present invention, the number of the lines at the first interface end is less than or equal to the number of the lines at the second interface end. Since the current flowing through the first interface end is smaller than the current flowing through the third interface end, a current sensor with a small measuring range can be used to measure the current flowing through the first interface end, and the current flowing through the third interface end can be estimated based on the ratio between the numbers of the lines.

As a further improvement of the present invention, the magnetic core of the power inductor is a closed magnetic core, comprising a first sub magnetic core and a second sub magnetic core. The winding comprises a first sub winding and a second sub winding, which are formed by winding the multiple lines on the first sub magnetic core and the second sub magnetic core respectively. The lines of the first sub winding and the lines of the second sub winding are connected conductively.

As a further improvement of the present invention, the power inductor further comprises an upper base and a lower base, wherein the magnetic core, the multiple lines and the winding are located in a space defined by the upper base and the lower base.

As a further improvement of the present invention, the upper base and the lower base of the power inductor are made of insulate material.

As a further improvement of the present invention, the power inductor further comprises a first insulator which is positioned between the first sub magnetic core and the multiple lines to insulate the first sub magnetic core from the multiple lines. The power inductor may further comprises a second insulator which is positioned between the second sub magnetic core and the multiple lines to insulate the second sub magnetic core from the multiple lines.

As a further improvement of the present invention, the multiple lines in the power inductor are formed by flat wires.

As a further improvement of the present invention, the flat planes of the flat wires in the power inductor are perpendicular to the longitudinal axis of the magnetic core.

The present invention also provide a method for measuring the current flowing through the third interface end in the power inductor, comprising measuring the current flowing through the first interface end, and estimating the current flowing through the third interface end, based on the ratio between the number of the lines at the first interface end and the total number of the multiple lines.

DETAILED DESCRIPTION OF THE PREFERRED EMBODIMENTS

The inductor winding of the present invention is split proportionally in order to split the inductor current proportionally. In this way, the total inductor current can be estimated by sampling on an inductor line with a smaller current using a current sensor 291 with a small measuring range, wherein the inductor line is one of the multiple lines of the winding 11.

Figure 1:
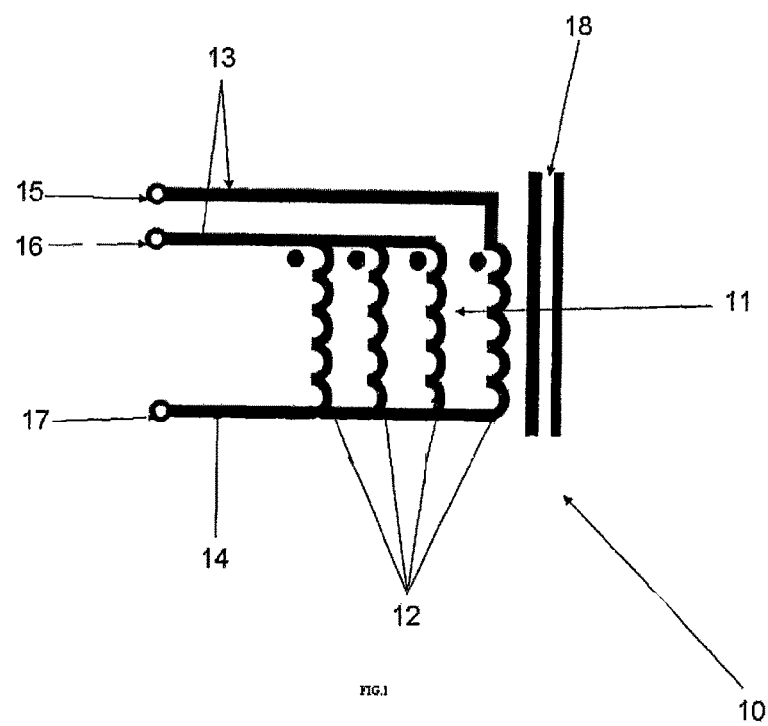
FIG. 1 illustrates a circuit diagram according to an embodiment of the present invention.

In one embodiment, a power inductor 10 comprises a magnetic core 18 and multiple lines 12. The multiple lines 12 have a first terminal 13 and a second terminal 14, and wind the magnetic core 18 in parallel with each other to form a winding 11. The lines at the first terminal 13 depart from the magnetic core 18 at the same position and the lines at the second terminal 14 depart from the magnetic core 18 at the same position. At least one line at the first terminal 13 forms a first interface end 15, and the other lines at the first terminal 13, which are not utilized to form the first interface end 15, form a second interface end 16. The lines at the second terminal 14 together form a third interface end 17. Taking the power inductor 10 shown in FIG. 1 for example, its winding 11 is formed by four lines (L1, L2, L3, L4) winding the magnetic core 18, wherein the four lines (L1, L2, L3, L4) have a first terminal 13 and a second terminal 14. One line (L4) at the first terminal 13 forms a first interface end 15, the other three lines (L1, L2, L3) at the first terminal 13 form a second interface end 16, and the four lines (L1, L2, L3, L4) at the second terminal 14 together form a third interface end 17. In this embodiment, the ratio between the current at the first interface end 15 and that at the third interface end 17 is 1:4, the ratio between the current at the second interface end 16 and that at the third interface end 17 is 3:4, and the ratio between the current at the first interface end 15 and that at the second interface end 16 is 1:3. As will be appreciated by one skilled in the art, the present invention is not limited by the proportional relations among the numbers of the lines at the first, second and third interface ends mentioned above. In addition to the aforesaid splitting ratios, there could be other splitting ratios (not shown in the figures), some of which are provided as below:

A. Winding 11 is formed by five lines: one line at the first interface end 15, four lines at the second interface end 16, and five lines at the third interface end 17. In this embodiment, the ratio between the current at the first interface end 15 and that at the third interface end 17 is 1:5, the ratio between the current at the second interface end 16 and that at the third interface end 17 is 4:5, and the ratio between the current at the first interface end 15 and that at the second interface end 16 is 1:4.

B. Winding 11 is formed by five lines: two lines at the first interface end 15, three lines at the second interface end 16, and five lines at the third interface end 17. In this embodiment, the ratio between the current at the first interface end 15 and that at the third interface end 17 is 2:5, the ratio between the current at the second interface end 16 and that at the third interface end 17 is 3:5, and the ratio between the current at the first interface end 15 and that at the second interface end 16 is 2:3.

C. Winding 11 is formed by three lines: one line at the first interface end 15, two lines at the second interface end 16, and three lines at the third interface end 17. In this embodiment, the ratio between the current at the first interface end 15 and that at the third interface end 17 is 1:3, the ratio between the current at the second interface end 16 and that at the third interface end 17 is 2:3, and the ratio between the current at the first interface end 15 and that at the second interface end 16 is 1:2.

D. Winding 11 is formed by two lines: one line at the first interface end 15, one line at the second interface end 16, and two lines at the third interface end 17. In this embodiment, the ratio between the current at the first interface end 15 and that at the third interface end 17 is 1:2, the ratio between the current at the second interface end 16 and that at the third interface end 17 is 1:2, and the ratio between the current at the first interface end 15 and that at the second interface end 16 is 1:1.

In one embodiment, the number of the lines at the first interface end 15 is less than or equal to the number of the lines at the second interface end 16. The situation shown in aforesaid example D is an example of the situation in which the number of the lines at the first interface end 15 is equal to the number of the lines at the second interface end 16, and the situation shown in aforesaid FIG. 1 or in example A, B, or C is an example of the situation in which the number of the lines at the first interface end 15 is less than the number of the lines at the second interface end 16. In this embodiment, a current sensor with a small measuring range can be used to measure the current flowing through the first interface end 15, and the current flowing through the third interface end 17 can then be estimated based on the measured current. Taking the power inductor 10 shown in FIG. 1 for example, since the amount of the current flowing through the first interface end 15 is one fourth of the amount of the current flowing through the third interface end 17, we can measure the current flowing through the first interface end 15 using a current sensor with a relatively small measuring range, multiply the measured amount by four, and then obtain the amount of the current flowing through the third interface end 17.

In one embodiment, the current sensor is placed to be suitable for measuring the current flowing through the first interface end 15. As mentioned above, since the amount of the current flowing through the first interface end 15 is less than the amount of the current flowing through the second interface end 16 or the third interface end 17, a current sensor with a relatively small measuring range can be placed at a position where it is suitable for measuring the current flowing through the first interface end 15. Then the amount of the current flowing through the third interface end 17 can be estimated based on the ratio between the numbers of the lines. The current sensor is a device well known by one skilled in the art, such as Hall Current Sensor.

Figure 2:
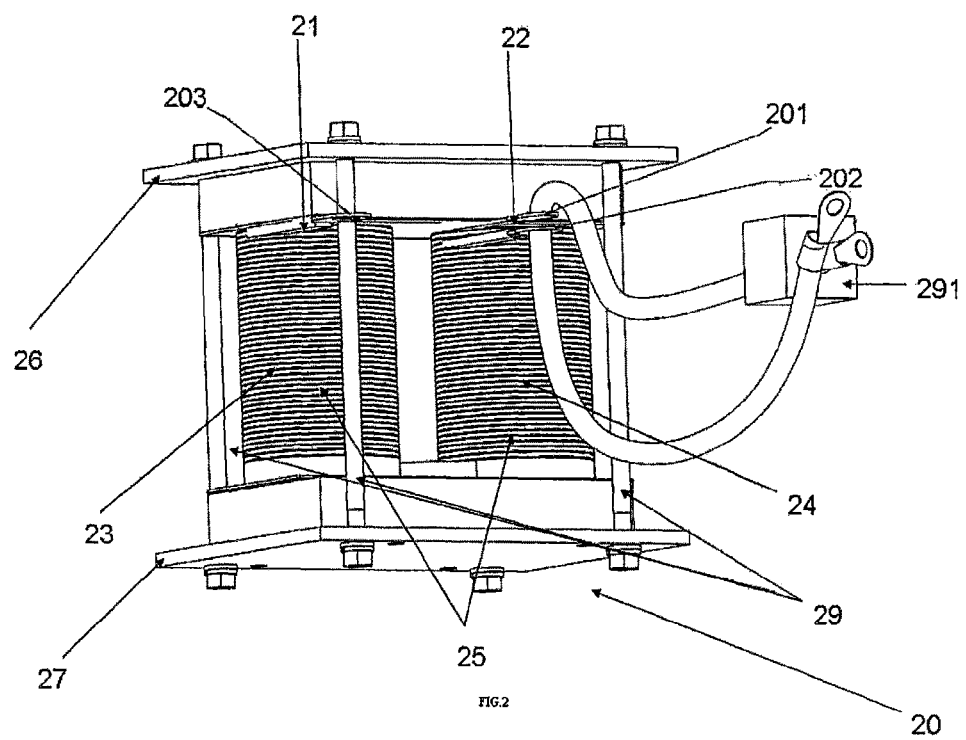
FIG. 2 illustrates a perspective view of an embodiment of the present invention.

In another embodiment, as shown in FIG. 2, the magnetic core of the power inductor is a closed magnetic core, comprising a first sub magnetic core 21, a second sub magnetic core 22 and two block magnetic cores (upper and lower block magnetic cores, not shown in FIG. 2). The winding comprises a first sub winding 23 and a second sub winding 24. The first sub winding 23 is formed by multiple lines winding the first sub magnetic core 21, and the second sub winding 24 is formed by multiple lines winding the second sub magnetic core 22. The lines of the first sub winding 23 and the lines of the second sub winding 24 are connected conductively. The conductive connection can be implemented in any ways well known by one skilled in the art, such as screwing or welding. Preferably, the connection is implemented by winding both the first sub magnetic core 21 and the second sub magnetic core 22 continuously using multiple lines 25, thus there is no external mechanical joint between the first sub winding 23 and the second sub winding 24, thereby increasing the winding efficiency and avoiding introducing additional DC impedance to the coils. Preferably, the connection between the lines of the first sub winding 23 and the lines of the second sub winding 24, and the leading directions of aforesaid first interface end 201, second interface end 202 and third interface end 203, are all configured to be suitable for positively coupling the coupled magnetic fields of the first sub winding 23 and the second sub winding 24.

In another embodiment, the power inductor 20 further comprises an upper base 26 and a lower base 27, wherein the magnetic cores 21 & 22, the multiple lines 25 and the windings 23 & 24 are located in a space defined by the upper base 26 and the lower base 27. Taking the power inductor shown in FIG. 2 for example, the upper base 26 and the lower base 27 are made of rigid sheet materials, and there are multiple rigid supports 29 of the same length perpendicular to the planes defined by the two bases 26 & 27, between the upper base 26 and the lower base 27 which are parallel with each other, wherein these supports 29 support and fix the upper base 26 and the lower base 27. The length of the rigid supports 29 is dependent on the length of the magnetic cores 21 & 22. The upper base 26 and the lower base 27, which are fixed by the supports 29 of proper length, define the space suitable for holding the magnetic cores 21 & 22, the multiple lines 25 and the windings 23 & 24. In one embodiment, the upper base 26 and the lower base 27 are made of insulate material.

In another embodiment, the power inductor 20 further comprises a first insulator and a second insulator (not shown in figures). The first insulator is positioned between the first sub magnetic core 21 and the multiple lines 25, to insulate the first sub magnetic core 21 from the multiple lines 25 winding it; the second insulator is positioned between the second sub magnetic core 22 and the multiple lines 25, to insulate the second magnetic core 22 from the multiple lines 25 winding it.

In one embodiment, the multiple lines 25 of the power inductor 20 are formed by flat wires, i.e. the cross section of each wire is substantially flat, to increase the current density. In another embodiment, the flat planes of the flat wires are perpendicular to the longitudinal axes of the first sub magnetic core 21 and the second sub magnetic core 22, i.e. the so called erectly rolling. By erectly rolling, the winding space can be decreased and the material used by winding 23 & 24 can be reduced, thereby decreasing the loss and cost of the coils of winding 23 & 24.

To proportionally split the current among the multiple lines, in a preferred embodiment, at least one of the following measures may be taken: determining the thickness of the flat wire based on the switching frequency and the current density choice of the power inductor, to avoid being affected by skin effect; winding the flat wires in parallel, so that the proximity effect can be mitigated; keeping enough insulation level and avoiding overlap among the flat wires; keeping the flat wires inside the winding closely parallel with each other with intervals less than 5 mm, and at the same time, parallelly wiring to form a coil, to ensure the corresponding magnetic field intensities to be the same; limiting the error range of the DC impedances of the flat wires within 5%; while winding the lines on the magnetic core, the start positions of the lines should be consistent, and the end positions of the lines should also be consistent; balancing the AC impedances of the wires by controlling the cross section areas of the wires; and using copper strip for the wires to make the magnetic core winding rate be above 50% and efficiently decrease the effect of thermal radiation among the respective windings.

Figure 3:
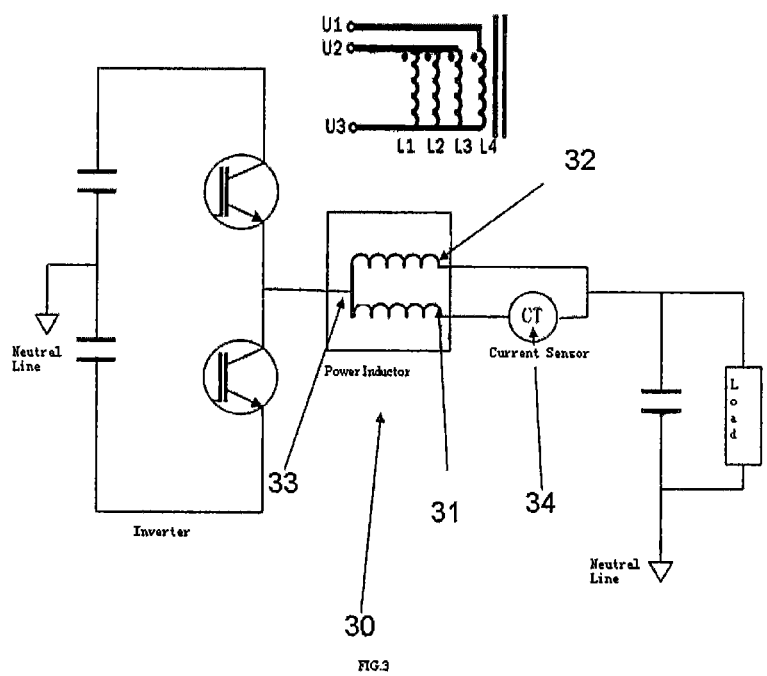
FIG. 3 illustrates an application topological diagram of the present invention.

The solution of the present invention has significant advantages in high power UPS or high power inverter applications. An exemplary application is shown in FIG. 3. As shown in FIG. 3, a first interface end 31 and a second interface end 32 of a power inductor 30 are connected with a load, and a third interface end 33 of the power inductor 30 is connected with an inverter. In addition, a current sensor 34 is placed at a position suitable for measuring the current flowing through the first interface end 31. Using the accurate shunting technology of the present invention, the relatively larger current flowing through the third interface end 33, i.e. the load end, can be estimated based on the ratio between the numbers of the lines and the current flowing through the first interface end 34, which can be measured by a current sensor with a relatively small measuring range.

The preferred embodiments of this invention herein have been described and illustrated in details with reference to the accompany figures, but it should be understood that the present invention is not limited by the above-mentioned embodiments, and the features and operations of the invention as described are susceptible to modification or alteration without departing from the spirit of the invention, within the knowledge of one skilled in the art.

What is claimed is:

1. A power inductor, comprising:
   a magnetic core;
   at least three lines, each having a first terminal and a second terminal, the at least three lines being wound around the magnetic core in parallel to form a winding, the lines proximate the first terminals departing from the magnetic core at a first position, and the lines proximate the second terminals departing from the magnetic core at a second position,
   wherein a first number of the at least three lines at the first terminals forms a first interface end, wherein a second number of the lines at the first terminals different from the first number of lines form a second interface end, and wherein all of the lines at the second terminals together form a third interface end; and
   a current sensor configured to measure a current flowing through the first number of the at least three lines exclusive of the second number of the at least three lines such that, when the first and second interface ends are coupled in common to an external device the current sensor measures a fraction of a total current passing between a combination of the first and second interface ends and the external device.

2. The power inductor of claim 1:
   wherein the magnetic core comprises a first sub magnetic core and a second sub magnetic core;
   wherein the winding comprises a first sub winding and a second sub winding on the first sub magnetic core and the second sub magnetic core, respectively; and
   wherein the lines of the first sub winding and the lines of the second sub winding are conductively connected.

3. The power inductor of claim 1, further comprising an upper base and a lower base, wherein the magnetic core, the multiple lines and the winding are located in a space defined by the upper base and the lower base.

4. The power inductor of claim 3, wherein the upper base and the lower base are made of insulating materials.

5. The power inductor of claim 1, further comprising insulators positioned between the magnetic core and the at least three lines.

6. The power inductor according to claim 1, wherein the at least three lines comprise flat wires.

7. The power inductor of claim 6, wherein flat planes of the flat wires are perpendicular to the longitudinal axis of the magnetic core.

8. A system comprising the power inductor of claim 1 wherein the first interface end and the second interface end are coupled in common and further comprising a current sensor configured to measure a current flowing through the first interface end.

9. A system comprising:
   inductor comprising a winding comprising a plurality of conductors, the conductors each having a first end and a second end, wherein a first connection point of the winding comprises at least one first end of a first subset of the conductors, wherein a second connection point of the winding comprises at least one first end of a second subset of the conductors and wherein a third connection point of the winding comprises the second ends of the conductors;

a device coupled in common to the first and second connection points; and a current sensor configured to sense a current in the second subset of conductors such that the sensed current is a fraction of a total current passing between the inductor and the device.

10. The system of claim 9, wherein the inductor comprises a magnetic core and wherein the conductors are wound on the magnetic core.

11. The system of claim 10, wherein the magnetic core comprises first and second magnetic cores and wherein the winding comprises a first sub winding and a second sub winding on the first core and the second core, respectively.

12. The system of claim 9, wherein the device comprises a load and wherein the third connection point is connected to a power source.

13. The system of claim 12, wherein the power source comprises an inverter.

14. A method comprising:

providing an inductor comprising a winding comprising a plurality of conductors, the conductors each having a first end and a second end, wherein a first connection point of the winding comprises at least one first end of a first subset of the conductors, wherein a second connection point of the winding comprises at least one first end of a second subset of the conductors and wherein a third connection point of the winding comprises the second ends of the conductors;

coupling the first and second connection points together;

sensing a current in the second subset of conductors such that the sensed current is a fraction of a total current passing through the plurality of conductor; and determining the total current through the first and second subsets of conductors from the sensed current through the second subset of conductors.

15. The method of claim 14, wherein coupling the first and second connection points together comprises coupling the first and second connection points in common to a load and wherein the method further comprise coupling the third connection point to a power source.

16. The method of claim 15, wherein the power source comprises an inverter.

17. The method of claim 14, wherein the inductor comprises a magnetic core and wherein the conductors are wound on the magnetic core.

18. The method of claim 14, wherein the magnetic core comprises first and second magnetic cores and wherein the winding comprises a first sub winding and a second sub winding on the first core and the second core, respectively.

* * * * *